(12) United States Patent
Harada et al.

(10) Patent No.: US 10,468,315 B2
(45) Date of Patent: Nov. 5, 2019

(54) POWER MODULE

(71) Applicant: Mitsubishi Electric Corporation, Chiyoda-ku (JP)

(72) Inventors: Kozo Harada, Chiyoda-ku (JP); Hiroyuki Harada, Chiyoda-ku (JP); Yasumichi Hatanaka, Chiyoda-ku (JP); Takashi Nishimura, Chiyoda-ku (JP); Masaki Taya, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/773,746

(22) PCT Filed: Nov. 1, 2016

(86) PCT No.: PCT/JP2016/082465
§ 371 (c)(1),
(2) Date: May 4, 2018

(87) PCT Pub. No.: WO2017/082122
PCT Pub. Date: May 18, 2017

(65) Prior Publication Data
US 2018/0323120 A1    Nov. 8, 2018

(30) Foreign Application Priority Data

Nov. 12, 2015  (JP) .................. 2015-222109

(51) Int. Cl.
*H01L 23/10*     (2006.01)
*H01L 25/07*     (2006.01)
*H01L 23/24*     (2006.01)
*H01L 23/00*     (2006.01)
*H01L 23/28*     (2006.01)
(Continued)

(52) U.S. Cl.
CPC ............ *H01L 23/10* (2013.01); *H01L 23/057* (2013.01); *H01L 23/20* (2013.01); *H01L 23/24* (2013.01);
(Continued)

(58) Field of Classification Search
CPC ......... H01L 23/10; H01L 23/24; H01L 24/48; H01L 25/072; H01L 2224/48091; H01L 2224/48137; H01L 2924/163
See application file for complete search history.

(56) References Cited

U.S. PATENT DOCUMENTS 5,243,223 A * 9/1993 Yamada .................. H01L 23/04
                                                     257/714
5,744,860 A    4/1998 Bayerer
(Continued)

FOREIGN PATENT DOCUMENTS

JP    2-134853 A    5/1990
JP    4-64255 A    2/1992
(Continued)

OTHER PUBLICATIONS

International Search Report dated Jan. 24, 2017 in PCT/JP2016/082465 filed Nov. 1, 2016.
(Continued)

*Primary Examiner* — Peniel M Gumedzoe
(74) *Attorney, Agent, or Firm* — Oblon, McClelland, Maier & Neustadt, L.L.P.

(57) ABSTRACT

The power module includes: an insulating substrate having an upper surface on which a semiconductor element is mounted; a base plate joined to a lower surface of the insulating substrate; a case member surrounding the insulating substrate and adhered to the base plate; a sealing resin provided in a region surrounded by the base plate and the case member, so as to seal the insulating substrate; and a
(Continued)

holding plate projecting from an inner wall of the case member to above an outer peripheral portion of the insulating substrate, the holding plate being fixed to the inner wall, the holding plate being in contact with the sealing resin.

6 Claims, 6 Drawing Sheets

(51) Int. Cl.
    *H01L 25/18*     (2006.01)
    *H01L 23/057*     (2006.01)
    *H01L 23/20*     (2006.01)

(52) U.S. Cl.
    CPC .............. *H01L 23/28* (2013.01); *H01L 24/48* (2013.01); *H01L 25/07* (2013.01); *H01L 25/072* (2013.01); *H01L 25/18* (2013.01); H01L 2224/48091 (2013.01); H01L 2224/48137 (2013.01); H01L 2224/48472 (2013.01); H01L 2224/49175 (2013.01); H01L 2224/73265 (2013.01); H01L 2924/13055 (2013.01); H01L 2924/163 (2013.01); H01L 2924/181 (2013.01); H01L 2924/19107 (2013.01)

(56) References Cited

U.S. PATENT DOCUMENTS

| | | | | |
|---|---|---|---|---|
| 5,751,058 A | * | 5/1998 | Matsuki | ................ H01L 25/072 |
| | | | | 257/678 |
| 6,791,174 B2 | * | 9/2004 | Matsuo | ................... H01L 23/16 |
| | | | | 257/680 |
| 2010/0117223 A1 | | 5/2010 | Truessel et al. | |
| 2014/0319669 A1 | * | 10/2014 | Kimijima | ................ H01L 23/42 |
| | | | | 257/687 |

FOREIGN PATENT DOCUMENTS

| | | |
|---|---|---|
| JP | 10-233472 A | 9/1998 |
| JP | 2000-311970 A | 11/2000 |
| JP | 3690278 B2 | 8/2005 |
| JP | 2010-533988 A | 10/2010 |
| JP | 2014-130875 A | 7/2014 |

OTHER PUBLICATIONS

Office Action dated Dec. 4, 2018 in Japanese Patent Application No. 2017-550276, 8 pages (with unedited computer generated English translation).

* cited by examiner

POWER MODULE

TECHNICAL FIELD

The present invention relates to a sealing structure for a power module, in which a power semiconductor element is sealed in a resin.

BACKGROUND ART

A type of semiconductor element in which a conductive path is provided in the longitudinal direction of the element in order to cope with high voltage or a large amount of current is generally referred to as a "power semiconductor element" (for example, an IGBT (Insulated Gate Bipolar Transistor), a MOSFET (Metal Oxide Semiconductor Field Effect Transistor), a bipolar transistor, a diode, or the like). A power module semiconductor device having a power semiconductor element mounted on a circuit board and packaged using a sealing resin has been used in a wide range of fields such as industrial devices, vehicles, and railways. In recent years, as the performance of an apparatus including such a power module semiconductor device becomes higher, the power module has been required to attain higher performance such as increased rated voltage and rated current, an increased operating temperature range (higher and lower temperatures), and the like.

A structure called "case structure" is mainly used for the package structure of the power module. The case type power module semiconductor device has such a structure that a power semiconductor element is mounted on a base plate for heat radiation with an insulating substrate being interposed therebetween and a case is adhered to the base plate. The semiconductor element mounted inside the power module semiconductor device is connected to a main electrode. A bonding wire is used for the connection between the power semiconductor element and the main electrode. Generally, as a sealing resin for the power module semiconductor device, an insulating gel filler such as a silicone gel is used in order to prevent insulation failure under application of high voltage.

As a conventional power module, there is disclosed a semiconductor device having a structure with a holding cover inserted in close contact with the upper surface of a silicone gel in order to prevent a bonding wire from being disconnected by movement of the silicone gel, wherein the holding cover has a side surface that is provided with a protrusion engaged with the inner wall of an outer case so as to be movable upward and downward (for example, Patent Document 1).

Moreover, there is disclosed a semiconductor device having a structure including a cover portion that covers the upper surface of a silicone gel and that has an end portion fixed to a case, wherein at least 80% of the upper surface of the silicone gel is in contact with the cover portion in a temperature range in which use thereof is permitted (for example, Patent Document 2).

CITATION LIST

Patent Document

PTD 1: Japanese Patent Laying-Open No. 2000-311970 (page 3; FIG. 1)
PTD 2: Japanese Patent Laying-Open No. 2014-130875 (page 4; FIG. 1)

SUMMARY OF INVENTION

Technical Problem

Generally, as the temperature is higher, a smaller amount of gas can be dissolved in the silicone gel. Therefore, as the operating temperature range of the power module is increased and the silicone gel is used at a higher temperature, an excess of gas, which is unable to be dissolved in the silicone gel, forms bubbles in the silicone gel. At a location with such formed bubbles, the silicone gel and the insulating substrate (interconnection pattern) are detached from each other, thus failing to obtain an effect of insulation sealing by the silicone gel. Accordingly, the insulation performance of the power module is deteriorated.

In order to suppress the occurrence of bubbles in the silicone gel as well as the detachment, the internal stress of the silicone gel to the insulating substrate should be compressive stress. This is because when the internal stress is tensile stress, the tensile stress increases and promotes the bubbles and detachment.

However, in Patent Document 1, even though the holding cover is inserted in close contact with the upper surface of the sealing resin, the holding cover is movable upward and downward with respect to the inner wall of the outer case. Accordingly, when the power semiconductor element is operated at a high temperature, the sealing resin can be thermally expanded to readily push up the holding cover, with the result that no compressive stress for suppressing the occurrence of bubbles is generated. Accordingly, the insulation performance of the power module is deteriorated.

On the other hand, in the power module described in Patent Document 2, since the end portion of the cover portion is fixed to the case, the holding plate cannot be pushed up by the silicone gel thermally expanded at a high temperature, with the result that the internal stress of the silicone gel becomes compressive stress. Accordingly, the occurrence of bubbles is suppressed. However, since the end portion of the cover portion is fixed to the case, the silicone gel is pulled to the cover portion at a low temperature while being thermally contracted, with the result that the internal stress of the silicone gel becomes tensile stress. When the internal stress of the silicone gel is tensile stress, a minute bubble, if any, in the silicone gel is increased in size by the tensile stress. Moreover, if there is a portion with weak adhesion at an interface between the silicone gel and the insulating substrate, an interface between the silicone gel and the power semiconductor element, or an interface between the gel and the wire, the tensile stress causes or promotes detachment at the interface. Due to the occurrence of such bubbles, the effect of the sealing insulation by the silicone gel is not obtained, with the result that the insulation performance of the power module is deteriorated.

Further, as higher voltage is used in the power module, dielectric breakdown is more likely to occur even when the sizes of the bubbles or detachment are smaller. This facilitates deterioration of the insulation of the module.

As such, the insulation performance of the conventional power module is deteriorated when the power module is used at a higher or lower temperature in the increased operating temperature range of the power module or when higher voltage is used for the power module, disadvantageously.

The present invention has been made to solve the above-described problems and obtain a power module not deteriorated in insulation performance by suppressing occurrence of bubbles and detachment of a silicone gel and an insulating substrate when the power module is used at a high or low temperature or when high voltage is used for the power module.

Solution to Problem

A power module according to the present invention includes: an insulating substrate having an upper surface on which a semiconductor element is mounted; a base plate joined to a lower surface of the insulating substrate; a case member surrounding the insulating substrate and adhered to the base plate; a sealing resin provided in a region surrounded by the base plate and the case member, so as to seal the insulating substrate; and a holding plate projecting from an inner wall of the case member to above an outer peripheral portion of the insulating substrate, the holding plate being fixed to the inner wall, the holding plate being in contact with the sealing resin.

Advantageous Effects of Invention

According to the present invention, the holding plate in contact with the sealing resin is provided at the inner wall of the case of the power module, whereby reliability of the power module can be improved.

DESCRIPTION OF EMBODIMENTS

The following describes embodiments of a power module of the present invention in detail with reference to figures. It should be noted that the present invention is not limited to the description below and can be appropriately modified without deviating from the gist of the present invention.

First Embodiment

Figure 1:
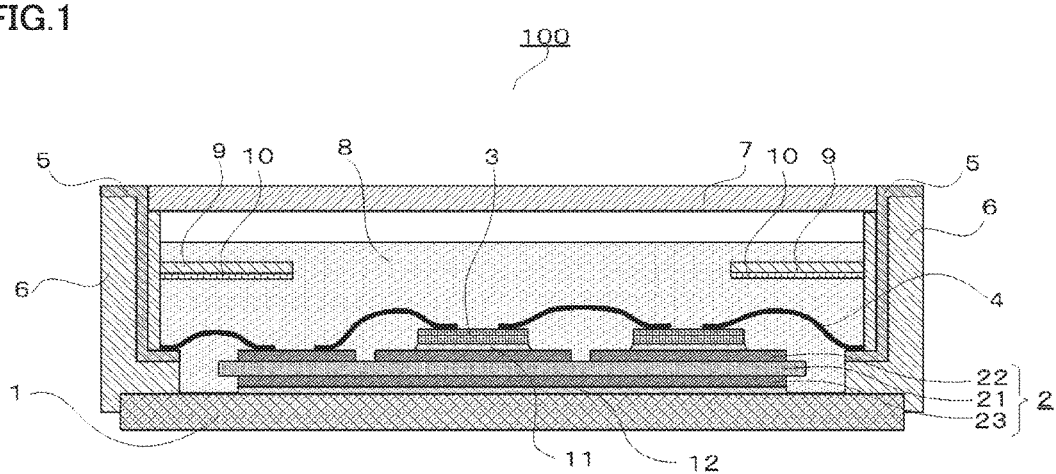
FIG. 1 is a schematic cross sectional view of a structure of a power module in a first embodiment of the present invention.

FIG. 1 is a schematic cross sectional view of a structure of a power module in a first embodiment of the present invention. In the figure, a power module 100 includes: a base plate 1; an insulating substrate 2; a power semiconductor element 3 serving as a semiconductor element; a bonding wire 4; a terminal 5; a case 6 serving as a case member; a cover 7 serving as a cover member; a silicone gel 8 serving as a sealing resin; a holding plate 9; a releasing treatment layer 10 serving as a releasing layer; a solder 11; and a solder 12.

Insulating substrate 2 has a lower surface joined onto base plate 1 using solder 12. Insulating substrate 2 includes an insulating layer 21 and metal plates 22, 23. Insulating substrate 2 has such a structure that metal plates 22, 23 are adhered to respective surfaces of insulating layer 21. Insulating layer 21 is composed of: a ceramic employing aluminum oxide, aluminum nitride, silicon nitride, or the like; an epoxy resin; or the like. Metal plates 22, 23 are composed of copper, aluminum or the like. An interconnection pattern is formed on metal plate 22 at the upper surface side of insulating substrate 2. Power semiconductor element 3 is joined, by solder 11, to metal plate 22 at the upper surface side of insulating substrate 2. Although the solder is used as the joining material herein, the joining material is not limited to this. The joining may be performed using a sintered silver, an electrically conductive adhesive agent, or a liquid phase diffusion joining technique.

For power semiconductor element 3, a semiconductor element for power control, a reflux diode, or the like is used. Examples of the semiconductor element for power control include a MOSFET (Metal Oxide Semiconductor Field Effect Transistor), an IGBT (Insulated Gate Bipolar Transistor), and the like. Power semiconductor element 3 and terminal 5 are electrically connected to each other via bonding wire 4. Bonding wire 4 has a wire diameter of 0.1 to 0.5 mm, and is a wire material composed of an aluminum alloy or copper alloy. Although bonding wire 4 is used herein, a bonding ribbon may be used.

Terminal 5 is a plate-like electrode composed of copper. Terminal 5 is formed in case 6 by insert molding or outsert molding, and is used for input/output of current and voltage. Case 6 is adhered to base plate 1 using an adhesive agent (not shown). Generally, as a material of case 6, a PPS (Poly Phenylene Sulfide) resin or a PBT (Poly Butylene Terephtalate) resin is used.

In order to secure an insulating property in power module 100, silicone gel 8 is provided in a region surrounded by case 6 and base plate 1. Silicone gel 8 is provided up to a height with which power semiconductor element 3 and bonding wire 4 are sealed.

Holding plate 9 is disposed at the inner wall (side wall) of case 6 to be sealed in silicone gel 8. Holding plate 9 is disposed at the inner wall of case 6 to project from the inner wall of case 6 toward the inner side of case 6 such that holding plate 9 is located above the outer peripheral portion of insulating substrate 2.

Releasing treatment layer 10 is provided at the lower surface (surface facing the insulating substrate) of holding plate 9. Releasing treatment layer 10 is a silicone-based or fluorine-based coating film, but may be composed of any material as long as adhesion (adhesiveness) with silicone gel 8 is weaker than adhesion with insulating substrate 2 and power semiconductor element 3 and occurrence of bubbles and detachment at insulating substrate 2 and power semiconductor element 3 can be prevented. With this releasing treatment layer 10, the adhesion between holding plate 9 and silicone gel 8 becomes lower than the adhesion between silicone gel 8 and each of insulating substrate 2 and power semiconductor element 3. Here, the term "adhesion" represents a degree of adherence between silicone gel 8 serving as the sealing resin and each of insulating substrate 2, case 6, and holding plate 9, which are components of power module 100. As the adhesion is lower, detachment from silicone gel 8 is more likely to occur. On the other hand, as the adhesion is higher, detachment from silicone gel 8 is less likely to occur.

Cover 7 is disposed at the upper portion of case 6. Cover 7 separates the inside and outside of power module 100, thereby preventing dust and the like from entering power module 100. Cover 7 is fixed to case 6 by an adhesive agent (not shown) or a screw (not shown).

Figure 2:
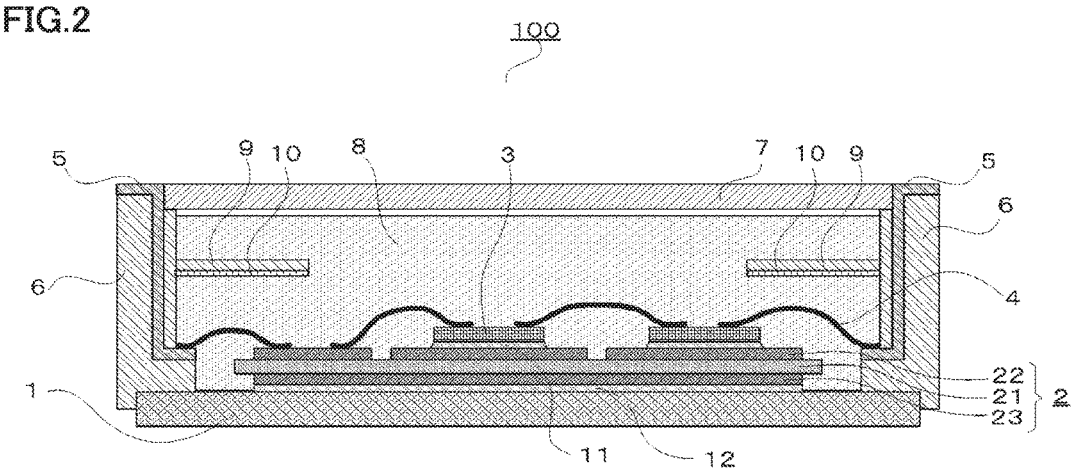
FIG. 2 is a schematic cross sectional view showing the structure of the power module in the first embodiment of the present invention at a high temperature.
Figure 3:
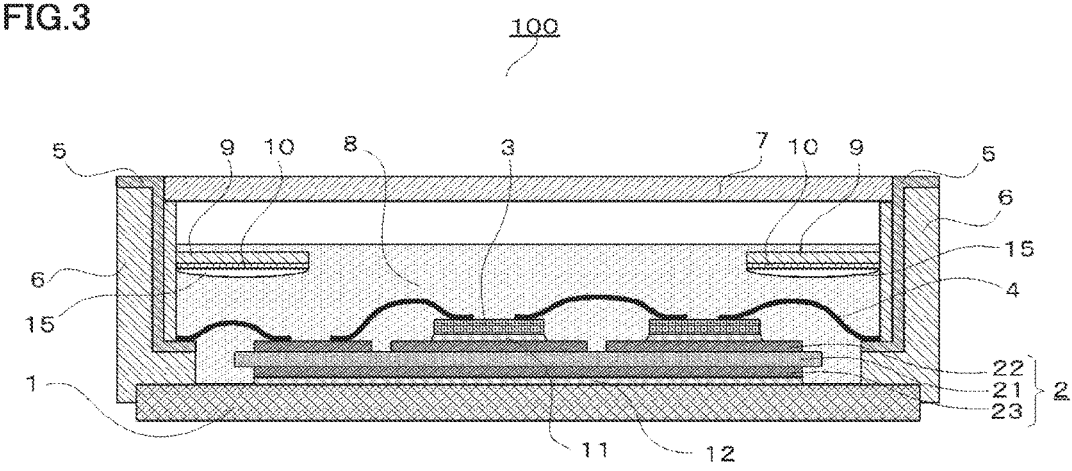
FIG. 3 is a schematic cross sectional view showing the structure of the power module in the first embodiment of the present invention at a low temperature.

FIG. 2 is a schematic cross sectional view showing the structure of the power module in the first embodiment of the present invention at a high temperature. FIG. 3 is a schematic cross sectional view showing the structure of the power module in the first embodiment of the present invention at a low temperature. FIG. 2 is a schematic cross sectional view showing the structure of power module 100 in the first embodiment of the present invention at such a high temperature that the temperature of power module 100 is increased to be more than or equal to the curing temperature of silicone gel 8. FIG. 3 is a schematic cross sectional view showing the structure of power module 100 in the first embodiment of the present invention at such a low temperature that the temperature of power module 100 is decreased to be less than or equal to the normal temperature.

The curing temperature of silicone gel 8 used for insulation sealing of power module 100 is normally 60 to 80° C. Moreover, the linear expansion coefficient of silicone gel 8 used for the insulation sealing material of power module 100 is normally 300 to 400 ppm/K. On the other hand, the linear expansion coefficient of each of the other components used for power module 100 is 3 to 25 ppm/K. The linear expansion coefficient of silicone gel 8 is larger in value by several ten times to one hundred and several ten times than the linear expansion coefficient of each of the other components used for power module 100.

Therefore, when the temperature of power module 100 becomes higher than the curing temperature, silicone gel 8 is thermally expanded more greatly than the other components, with the result that the height of the surface of silicone gel 8 becomes higher than the location thereof at the time of curing as shown in FIG. 2.

On the other hand, when the temperature of power module 100 is decreased to be less than or equal to the normal temperature, silicone gel 8 is thermally contracted more greatly than the other components. On this occasion, as shown in FIG. 3, the height of the surface of silicone gel 8 becomes lower than the height of the surface of silicone gel 8 at the time of curing. Further, silicone gel 8 is detached in the direction toward the surface of holding plate 9 facing insulating substrate 2, thereby forming a space 15.

In such a power module 100, when the temperature of power module 100 becomes high, silicone gel 8 is thermally expanded to exert stress in a direction to push up holding plate 9 toward cover 7. On this occasion, since holding plate 9 is fixed to case 6, holding plate 9 cannot be moved in the direction of cover 7 and silicone gel 8 cannot be thermally expanded. As a result, the internal stress of silicone gel 8 becomes compressive stress to insulating substrate 2 (stress is generated in the direction toward insulating substrate 2). Since the internal stress of silicone gel 8 becomes the compressive stress, insulating substrate 2 and silicone gel 8 can be suppressed from being detached from each other even when the temperature of power module 100 becomes high, thus attaining an effect of suppressing growth of bubbles and detachment in power module 100 and suppressing insulation failure of the power module.

Moreover, when the temperature of power module 100 becomes low, silicone gel 8 is thermally contracted to be detached from holding plate 9 by releasing treatment layer 10 provided at the backside surface of holding plate 9, thereby forming space 15. Accordingly, the internal stress of silicone gel 8 to insulating substrate 2 can be suppressed from being tensile stress. Therefore, insulating substrate 2 and silicone gel 8 can be suppressed from being detached from each other even when the temperature of power module 100 becomes low, thus attaining an effect of suppressing growth of bubbles and detachment in power module 100 and suppressing insulation failure of the power module.

Figure 4:
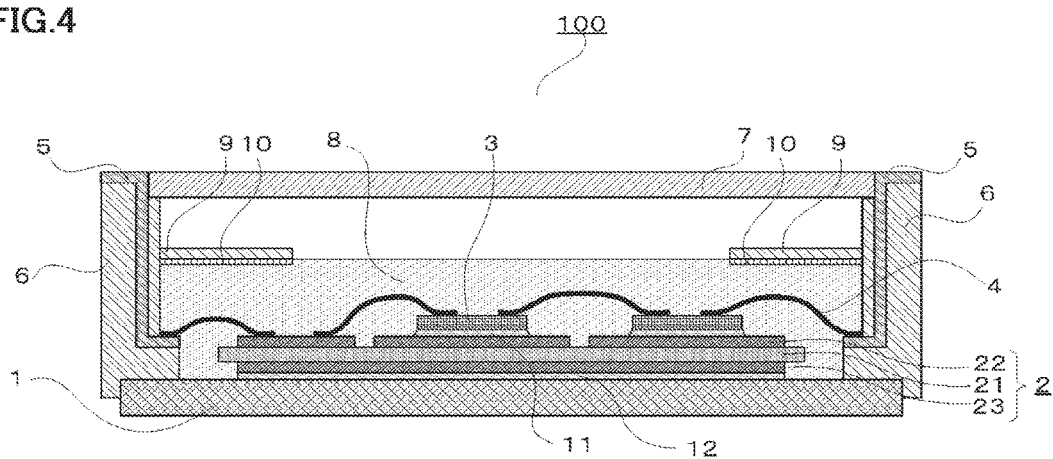
FIG. 4 is a schematic cross sectional view of a structure of another power module in the first embodiment of the present invention.

FIG. 4 is a schematic cross sectional view showing a structure of another power module in the first embodiment of the present invention. The configuration of power module 100 is the same as that shown in FIG. 1, but is different therefrom in terms of the height of silicone gel 8 in the normal state. In the case of power module 100 shown in FIG. 4, holding plate 9 is disposed in contact with the upper surface of silicone gel 8.

Figure 5:
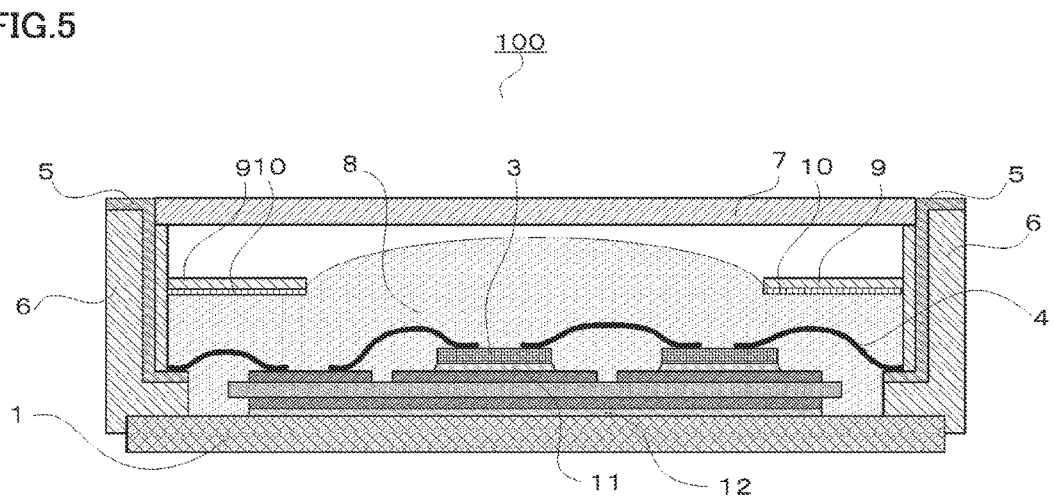
FIG. 5 is a schematic cross sectional view showing a structure of another power module in the first embodiment of the present invention at a high temperature.
Figure 6:
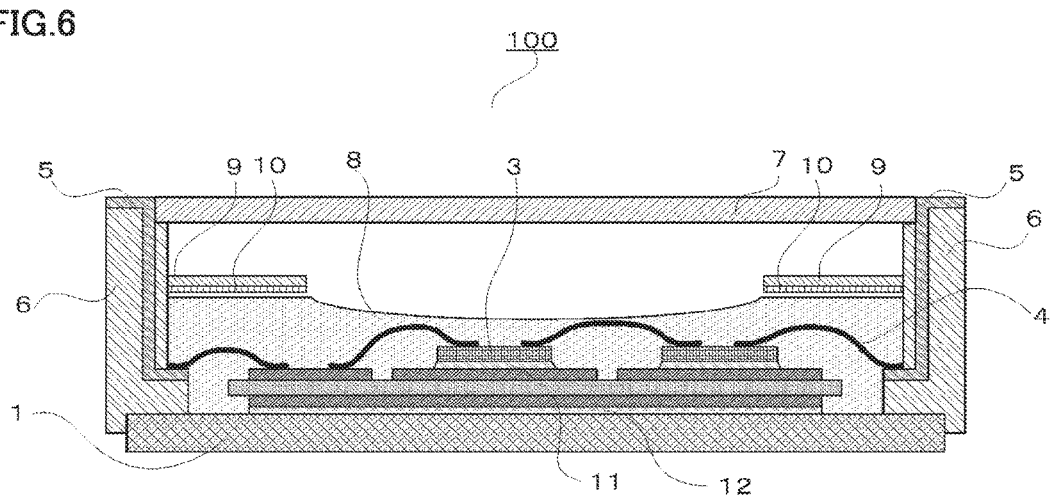
FIG. 6 is a schematic cross sectional view showing the structure of the other power module in the first embodiment of the present invention at a low temperature.

FIG. 5 is a schematic cross sectional view showing the structure of the other power module in the first embodiment of the present invention at a high temperature. FIG. 6 is a schematic cross sectional view showing the structure of the other power module in the first embodiment of the present invention at a low temperature. FIG. 5 is a schematic cross sectional view showing the structure of the other power module 100 in the first embodiment of the present invention at such a high temperature that the temperature of power module 100 is increased to be more than or equal to the curing temperature of silicone gel 8. FIG. 6 is a schematic cross sectional view showing the structure of the other power module 100 in the first embodiment of the present invention at such a low temperature that the temperature of the other power module 100 is decreased to be less than or equal to the normal temperature.

Thus, even when the height of silicone gel 8 in the normal state reaches with holding plate 9, it is possible to obtain the same effect as that in the case where holding plate 9 shown in FIG. 1 is disposed in silicone gel 8 in the normal state.

Figure 7:
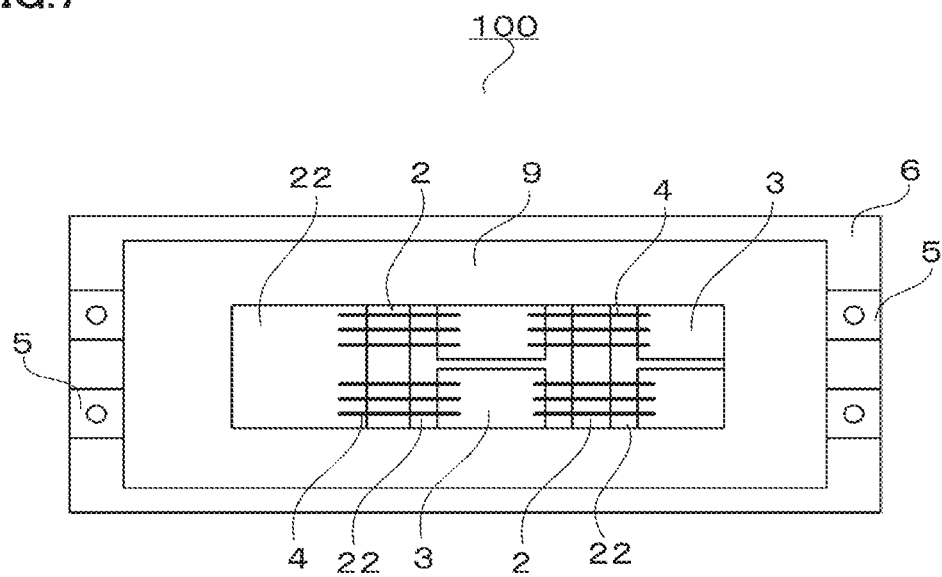
FIG. 7 is a schematic plan view showing a structure of a power module in the first embodiment of the present invention.
Figure 8:
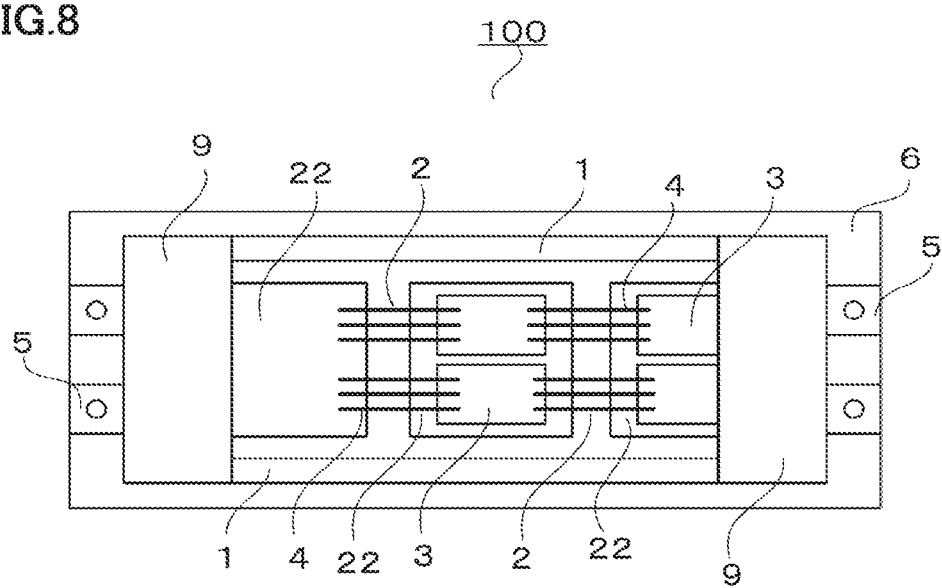
FIG. 8 is a schematic plan view showing a structure of another power module in the first embodiment of the present invention.

FIG. 7 is a schematic plan view showing a structure of a power module in the first embodiment of the present invention. FIG. 8 is a schematic plan view of a structure of another power module in the first embodiment of the present invention. FIG. 7 is a schematic plan view of the structure when holding plate 9 is provided at the four sides (disposed at the entire periphery) of the inner wall (side wall) of case 6 of power module 100. FIG. 8 is a schematic plan view of the structure when holding plates 9 are provided at sides, at which terminals 5 are provided, of the inner wall of case 6 of power module 100. This is an example in which holding plates 9 are disposed to cover a surface at which power semiconductor element 3 is along insulating substrate 2 at the short sides of power module 100 near the inner wall of case 6 provided with terminals 5, when holding plate 9 cannot be disposed at the entire periphery of the inner wall of the case due to a layout of insulating substrate 2, power semiconductor element 3, bonding wire 4, and terminals 5. At the short sides of power module 100, stress is changed greatly in response to a change in temperature of silicon gel 8.

As shown in the figures, holding plate 9 is disposed above and overlaps with insulating substrate 2 when viewed in a top view, thereby preventing the internal stress of silicone gel 8 from becoming tensile stress. As a result, insulating substrate 2 and silicone gel 8 can be suppressed from being detached from each other in response to a change in temperature of power module 100, thus attaining an effect of suppressing growth of bubbles and detachment in power module 100 and suppressing insulation failure of the power module. The disposition of holding plate 9 as shown in each of the figures can be similarly applied to both the case of power module 100 shown in FIG. 1 and the case of the other power module 100 shown in FIG. 4.

In each of the power modules configured as described above, holding plate 9 is disposed at the inner wall of case 6 in contact with silicone gel 8 or to be sealed in silicone gel 8, thereby suppressing growth of bubbles and detachment caused by a change in stress resulting from expansion and contraction of the sealing resin in response to a change in temperature of the power module. As a result, silicone gel 8 and insulating substrate 2 can be suppressed from being detached from each other, thus improving insulation reliability of the power module.

Moreover, when the temperature of the power module is high, silicone gel 8 is thermally expanded; however, under holding plate 9 disposed at case 6, the expansion is suppressed by holding plate 9, with the result that the internal stress of silicone gel 8 to insulating substrate 2 becomes compressive stress. Accordingly, the bubbles and detachment can be suppressed, thereby suppressing insulation failure of the power module.

Further, when the temperature of the power module is low, silicone gel 8 is thermally contracted; however, silicone gel 8 is detached from the backside surface of holding plate 9 provided with releasing treatment layer 10, with the result that silicone gel 8 is pulled down in the direction of insulating substrate 2. As a result, the tensile stress of silicone gel 8 to insulating substrate 2 is relaxed, thereby suppressing bubble growth and detachment. Accordingly, insulation failure of the power module can be suppressed.

Second Embodiment

A second embodiment is different from the first embodiment in that a hook-like protrusion 13 is formed at the tip of holding plate 9. Also in the case where protrusion 13 is thus formed at the end portion of holding plate 9, the growth of bubbles and detachment due to a change in stress caused by expansion and contraction of the sealing resin can be suppressed. As a result, the sealing resin and the insulating substrate can be suppressed from being detached from each other, thus improving insulation reliability of the power module.

Moreover, when silicone gel 8 is detached from holding plate 9 by releasing treatment layer 10 of holding plate 9 at a low temperature, a crack may be generated in silicone gel 8 on a line extending from the origin of detachment. By forming hook-like protrusion 13, the detachment of silicone gel 8 and releasing treatment layer 10 on the backside surface of holding plate 9 is prevented from being further promoted, thus attaining an effect of suppressing the crack in silicone gel 8.

Figure 9:
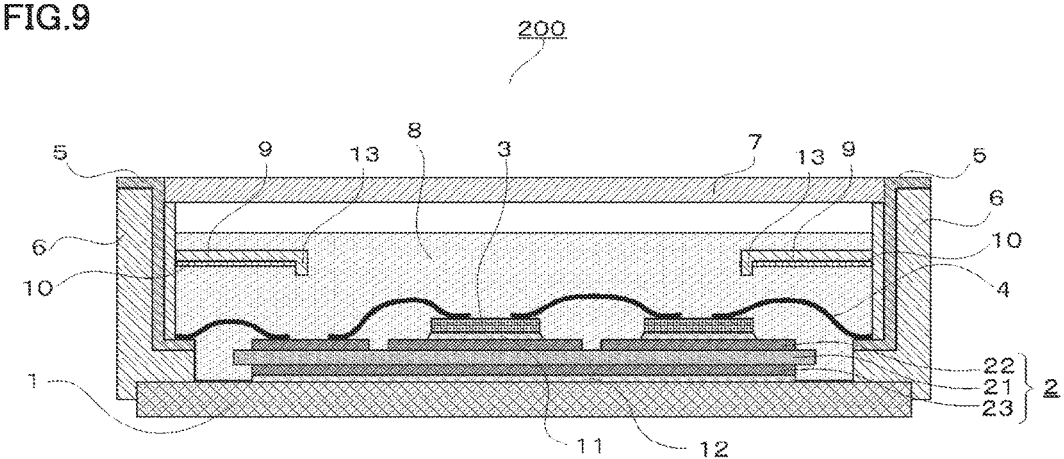
FIG. 9 is a schematic cross sectional view showing a structure of a power module in a second embodiment of the present invention.
Figure 10:
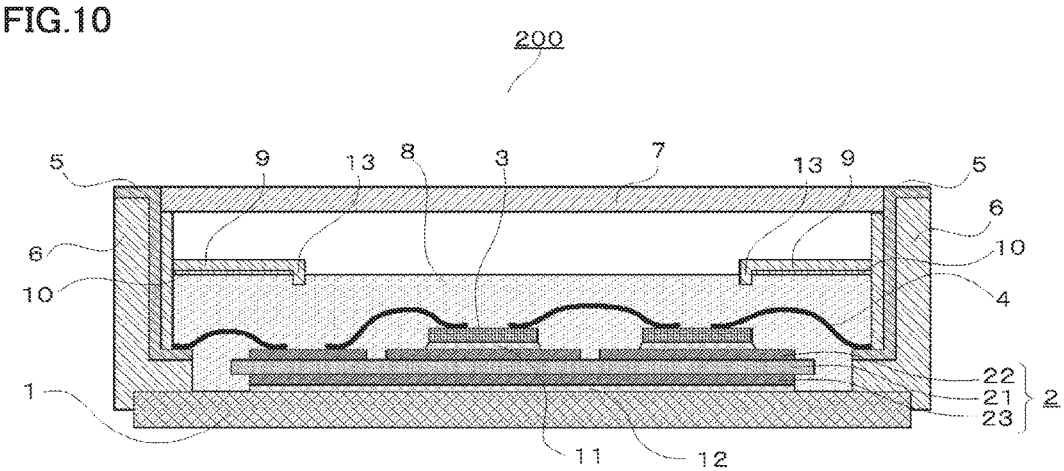
FIG. 10 is a schematic cross sectional view showing a structure of another power module in the second embodiment of the present invention.

FIG. 9 is a schematic cross sectional view showing a structure of a power module in the second embodiment of the present invention. FIG. 10 is a schematic cross sectional view showing a structure of another power module in the second embodiment of the present invention. In each of the figures, a power module 200 includes: base plate 1; insulating substrate 2; power semiconductor element 3 serving as a semiconductor element; bonding wire 4; terminal 5; case 6 serving as a case member; cover 7 serving as a cover member; silicone gel 8 serving as a sealing resin; holding plate 9; releasing treatment layer 10 serving as a releasing layer; solder 11; solder 12; and hook-like protrusion 13 serving as a projection portion.

Holding plate 9 is disposed in close contact with the upper surface of silicone gel 8 or is disposed to be sealed therein.

In power module 200 thus configured, insulation failure can be suppressed by the same mechanism as that in power module 100 of the first embodiment.

When the temperature of power module 200 becomes high, silicone gel 8 is thermally expanded to exert stress in a direction to push up holding plate 9 toward cover 7. On this occasion, since holding plate 9 is fixed to case 6, holding plate 9 cannot be moved in the direction of cover 7 and silicone gel 8 cannot be thermally expanded, with the result that the internal stress of silicone gel 8 becomes compressive stress to insulating substrate 2. Since the internal stress of silicone gel 8 becomes compressive stress, the growth of bubbles and detachment can be suppressed even when the temperature of power module 200 becomes high, thereby attaining an effect of suppressing insulation failure of the power module.

Moreover, when the temperature of power module 200 becomes low, silicone gel 8 is thermally contracted to be detached from holding plate 9 by releasing treatment layer 10 provided at the backside surface of holding plate 9. Accordingly, the internal stress of silicone gel 8 to insulating substrate 2 can be suppressed from being tensile stress. Therefore, the growth of bubbles and detachment can be suppressed even when the temperature of power module 200 becomes low, thereby attaining an effect of suppressing insulation failure of the power module.

Further, when silicone gel 8 is detached from holding plate 9 by releasing treatment layer 10 of holding plate 9 in the case where the temperature of power module 200 becomes low, a crack may be generated in silicone gel 8 on a line extending from the origin of detachment. However, by forming hook-like protrusion 13 at holding plate 9, the detachment of silicone gel 8 and releasing treatment layer 10 on the backside surface of holding plate 9 is prevented from being further promoted, thus suppressing the crack in silicone gel 8.

Also in power module 200, the planar structure as shown in each of FIGS. 7 and 8 can be employed. Holding plate 9 is disposed above and overlaps with insulating substrate 2 when viewed in a top view, thereby preventing the internal stress of silicone gel 8 from becoming tensile stress. As a result, insulating substrate 2 and silicone gel 8 can be suppressed from being detached from each other in response to a change in temperature of power module 200, thus attaining an effect of suppressing growth of bubbles and detachment in power module 200 and suppressing insulation failure of power module 200. The disposition of holding plate 9 as shown in each of the figures can be similarly applied to both the case of power module 100 shown in FIG. 1 and the case of the other power module 200 shown in FIG. 49.

In each of the power modules configured as described above, holding plate 9 is disposed at the inner wall of case 6 in contact with silicone gel 8 or to be sealed in silicone gel 8, thereby suppressing growth of bubbles and detachment caused by a change in stress resulting from expansion and contraction of silicone gel 8 in response to a change in temperature of the power module. As a result, silicone gel 8 and insulating substrate 2 can be suppressed from being detached from each other, thus improving insulation reliability of the power module.

Moreover, when the temperature of the power module is high, silicone gel 8 is thermally expanded; however, under holding plate 9 disposed at case 6, the expansion is suppressed by holding plate 9, with the result that the internal stress of silicone gel 8 to insulating substrate 2 becomes compressive stress. Accordingly, the bubbles and detachment can be suppressed, thereby suppressing insulation failure of the power module.

Further, when the temperature of the power module is low, silicone gel 8 is thermally contracted; however, silicone gel 8 is detached from the backside surface of holding plate 9 provided with releasing treatment layer 10, with the result that silicone gel 8 is pulled down in the direction of insulating substrate 2. As a result, the tensile stress of silicone gel 8 to insulating substrate 2 is relaxed, thereby suppressing bubble growth and detachment. Accordingly, insulation failure of the power module can be suppressed.

Moreover, since holding plate 9 is provided with hook-like protrusion 13, when silicone gel 8 is detached from holding plate 9 by releasing treatment layer 10 of holding plate 9 at a low temperature, a crack may be generated in silicone gel 8 on a line extending from the origin of detachment. By forming hook-like protrusion 13, the detachment of silicone gel 8 and releasing treatment layer 10 on the backside surface of holding plate 9 is prevented from being further promoted, thus suppressing the crack in silicone gel 8.

Third Embodiment

A third embodiment is different from the first embodiment in that a releasing/holding plate 14 composed of a releasing material is used instead of holding plate 9. Thus, even though holding plate 9 is formed using the releasing material, the growth of bubbles and detachment due to a change in stress caused by expansion and contraction of the sealing resin can be suppressed. As a result, the sealing resin and the insulating substrate can be suppressed from being detached from each other, thus improving insulation reliability of the power module.

Figure 11:
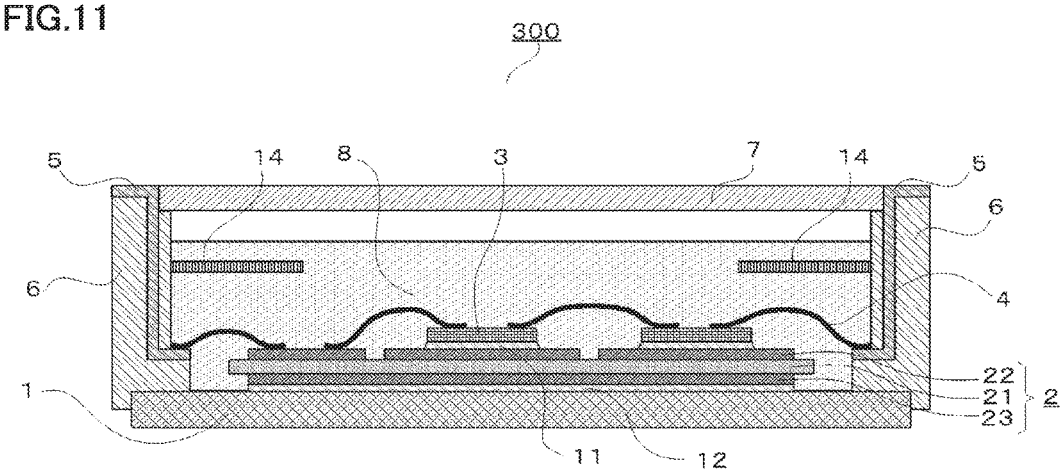
FIG. 11 is a schematic cross sectional view showing a structure of a power module in a third embodiment of the present invention.

FIG. 11 is a schematic cross sectional view showing a structure of a power module in the third embodiment of the present invention. In the figure, a power module 300 includes: base plate 1; insulating substrate 2; power semiconductor element 3 serving as a semiconductor element; bonding wire 4; terminal 5; case 6 serving as a case member; cover 7 serving as a cover member; silicone gel 8 serving as a sealing resin; solder 11; solder 12; and releasing/holding plate 14.

Releasing/holding plate 14 is formed at the inner wall of case 6 in close contact with the upper surface of silicone gel 8 or to be sealed therein.

Releasing/holding plate 14 is a silicone-based or fluorine-based plate member, but may be composed of any material as long as it has adhesion (adhesiveness) weaker than insulating substrate 2 and power semiconductor element 3 and occurrence of bubbles and detachment at insulating substrate 2 and power semiconductor element 3 can be prevented. With this releasing/holding plate 14, the adhesion between releasing/holding plate 14 and silicone gel 8 becomes lower than the adhesion between silicone gel 8 and each of insulating substrate 2 and power semiconductor element 3.

Figure 12:
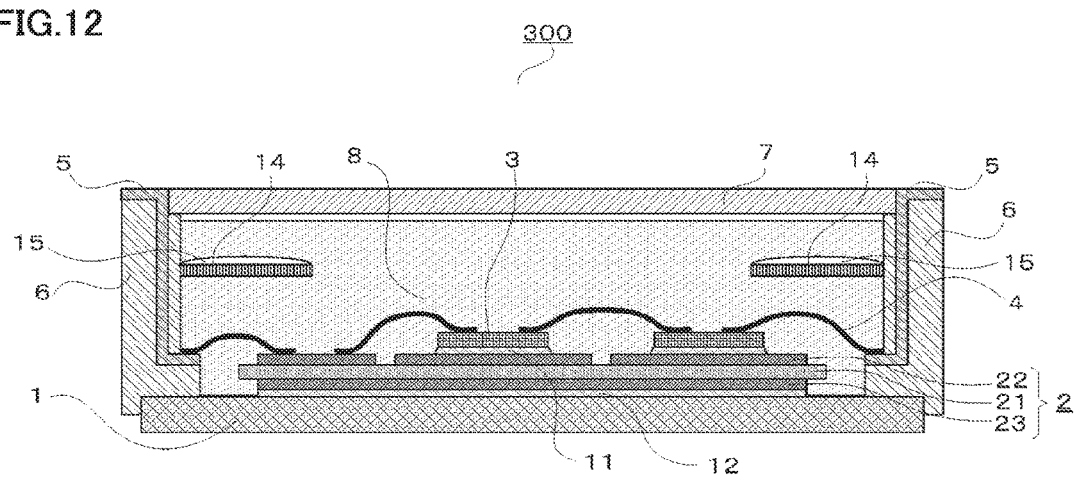
FIG. 12 is a schematic cross sectional view showing the structure of the power module in the third embodiment of the present invention at a high temperature.
Figure 13:
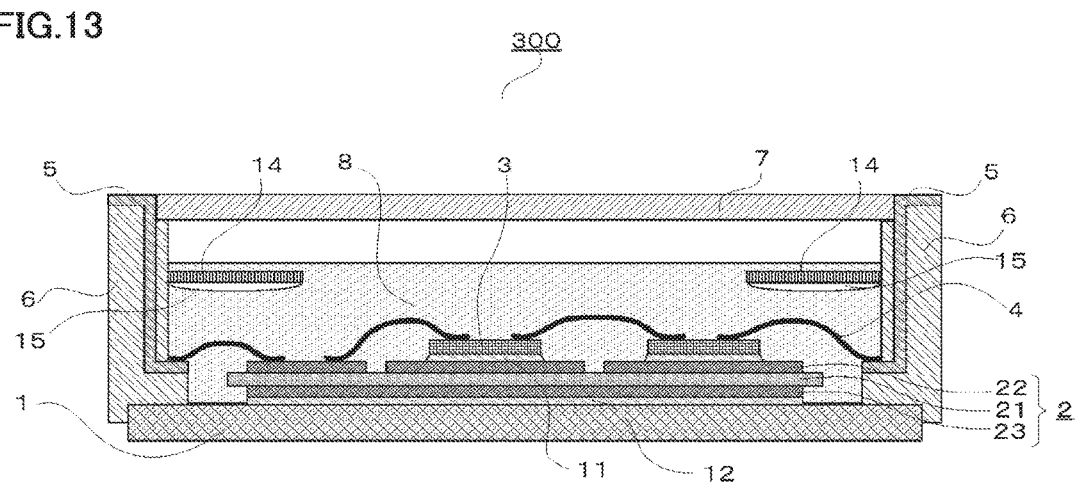
FIG. 13 is a schematic cross sectional view showing the structure of the power module in the third embodiment of the present invention at a low temperature.

FIG. 12 is a schematic cross sectional view showing the structure of the power module in the third embodiment of the present invention at a high temperature. FIG. 13 is a schematic cross sectional view showing the structure of the power module in the third embodiment of the present invention at a low temperature. FIG. 12 is a schematic cross sectional view showing the structure of power module 300 in the third embodiment of the present invention at such a high temperature that the temperature of power module 300 is increased to be more than or equal to the curing temperature of silicone gel 8. FIG. 13 is a schematic cross sectional view showing the structure of power module 300 in the third embodiment of the present invention at such a low temperature that the temperature of power module 300 is decreased to be less than or equal to the normal temperature.

The curing temperature of silicone gel 8 used for insulation sealing of power module 300 is normally 60 to 80° C. Moreover, the linear expansion coefficient of silicone gel 8 used for the insulation sealing material of power module 300 is normally 300 to 400 ppm/K. On the other hand, the linear expansion coefficient of each of the other components used for power module 300 is 3 to 25 ppm/K. The linear expansion coefficient of silicone gel 8 is larger in value by several ten times to one hundred and several ten times than the linear expansion coefficient of each of the other components used for power module 300.

Therefore, when the temperature of power module 300 becomes higher than the curing temperature, silicone gel 8 is thermally expanded more greatly than the other components, with the result that the height of the surface of silicone gel 8 becomes higher than the location thereof at the time of curing as shown in FIG. 12. Further, silicone gel 8 is detached in the direction toward the surface of releasing/holding plate 14 facing cover 7, thereby forming space 15.

On the other hand, when the temperature of power module 300 is decreased to be less than or equal to the normal temperature, silicone gel 8 is thermally contracted more greatly than the other components. On this occasion, as shown in FIG. 13, the height of the surface of silicone gel 8 becomes lower than the height of the surface of silicone gel 8 at the time of curing. Further, silicone gel 8 is detached in the direction toward the surface of releasing/holding plate 14 facing insulating substrate 2, thereby forming space 15.

In such a power module 300, when the temperature of power module 300 becomes high, silicone gel 8 is thermally expanded to exert stress in a direction to push up releasing/holding plate 14 toward cover 7. On this occasion, since releasing/holding plate 14 is fixed to case 6, holding plate 9 cannot be moved in the direction of cover 7 and silicone gel 8 cannot be thermally expanded. As a result, the internal stress of silicone gel 8 becomes compressive stress to insulating substrate 2 (stress is generated in the direction toward insulating substrate 2). Since the internal stress of silicone gel 8 becomes the compressive stress, insulating substrate 2 and silicone gel 8 can be suppressed from being detached from each other even when the temperature of power module 300 becomes high, thus attaining an effect of suppressing growth of bubbles and detachment in power module 300 and suppressing insulation failure of power module 300.

Moreover, when the temperature of power module 300 becomes low, silicone gel 8 is thermally contracted to be detached from releasing/holding plate 14, thereby forming space 15. Accordingly, the internal stress of silicone gel 8 to insulating substrate 2 can be suppressed from being tensile stress. Therefore, insulating substrate 2 and silicone gel 8 can be suppressed from being detached from each other even when the temperature of power module 300 becomes low, thus attaining an effect of suppressing growth of bubbles and detachment in power module 300 and suppressing insulation failure of power module 300.

Figure 14:
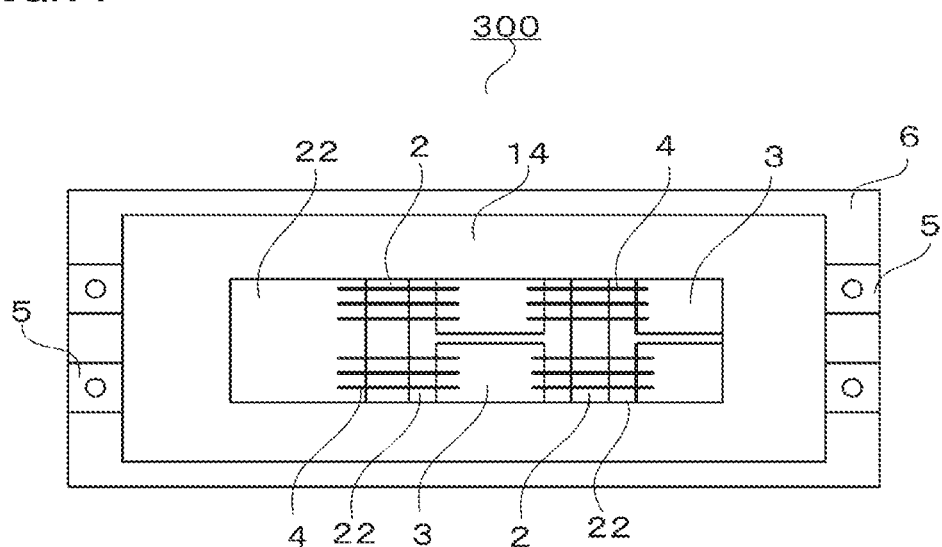
FIG. 14 is a schematic plan view showing a structure of a power module in the third embodiment of the present invention.
Figure 15:
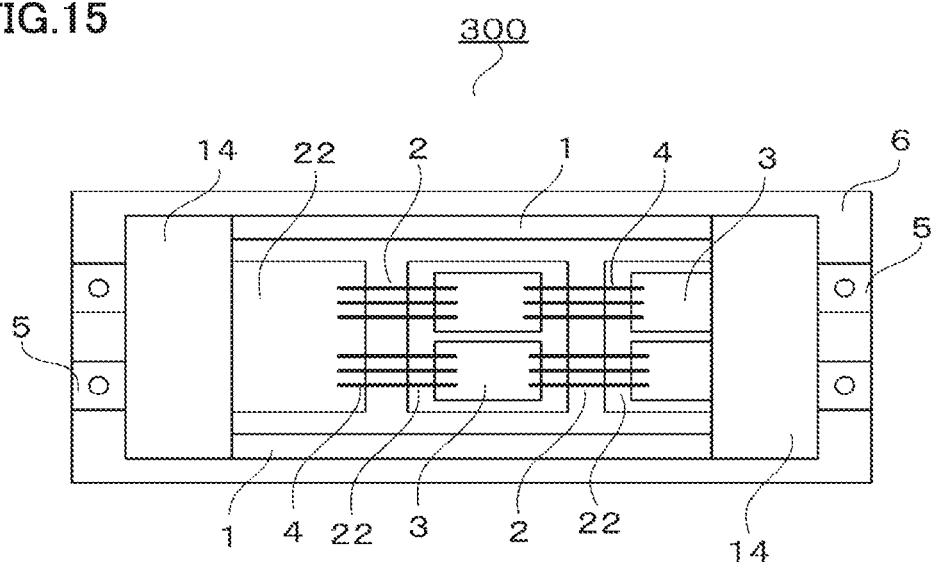
FIG. 15 is a schematic plan view showing a structure of another power module in the third embodiment of the present invention.

FIG. 14 is a schematic plan view showing a structure of a power module in the third embodiment of the present invention. FIG. 15 is a schematic plan view showing a structure of another power module in the third embodiment of the present invention.

FIG. 14 is a schematic plan view of the structure when releasing/holding plate 14 is provided at the four sides (disposed at the entire periphery) of the inner wall (side wall) of case 6 of power module 300. FIG. 15 is a schematic plan view of the structure when releasing/holding plates 14 are provided at sides, at which terminals 5 are provided, of the inner wall of case 6 of power module 300. This is an example in which releasing/holding plates 14 are disposed to cover a surface at which power semiconductor element 3 is along insulating substrate 2 at the short sides of power module 300 near the inner wall of case 6 provided with terminals 5, when releasing/holding plate 14 cannot be disposed at the entire periphery of the inner wall of the case due to a layout of insulating substrate 2, power semiconductor element 3, bonding wire 4, and terminals 5. At the short sides of power module 100, stress is changed greatly in response to a change in temperature of silicon gel 8.

As shown in the figures, releasing/holding plate 14 is disposed above and overlaps with insulating substrate 2 when viewed in a top view, thereby preventing the internal stress of silicone gel 8 from becoming tensile stress. As a result, insulating substrate 2 and silicone gel 8 can be suppressed from being detached from each other in response to a change in temperature of power module 300, thus attaining an effect of suppressing growth of bubbles and detachment in power module 300 and suppressing insulation failure of the power module.

In each of the power modules configured as described above, releasing/holding plate 14 is disposed at the inner wall of case 6 in contact with silicone gel 8 or to be sealed in silicone gel 8, thereby suppressing growth of bubbles and detachment caused by a change in stress resulting from expansion and contraction of silicone gel 8 in response to a change in temperature of the power module. As a result, silicone gel 8 and insulating substrate 2 can be suppressed from being detached from each other, thus improving insulation reliability of the power module.

Moreover, when the temperature of the power module is high, silicone gel 8 is thermally expanded; however, under releasing/holding plate 14 disposed at case 6, the expansion is suppressed by releasing/holding plate 14, with the result that the internal stress of silicone gel 8 to insulating substrate 2 becomes compressive stress.

Accordingly, the bubbles and detachment can be suppressed, thereby suppressing insulation failure of the power module.

Further, when the temperature of the power module is low, silicone gel 8 is thermally contracted; however, silicone gel 8 is detached from the backside surface of releasing/holding plate 14, with the result that silicone gel 8 is pulled down in the direction of insulating substrate 2. As a result, the tensile stress of silicone gel 8 to insulating substrate 2 is relaxed, thereby suppressing bubble growth and detachment. Accordingly, insulation failure of the power module can be suppressed.

REFERENCE SIGNS LIST

1: base plate; 2: insulating substrate; 3: power semiconductor element; 4: bonding wire; 5: terminal; 6: case; 7: cover; 8: silicone gel; 9: holding plate; 10: releasing treatment layer; 11: solder; 12: solder; 13: hook-like protrusion; 14: releasing/holding plate; 15: space; 21: insulating layer; 22: metal plate; 23: metal plate; 100, 200, 300: power module.

The invention claimed is:
1. A power module comprising:
an insulating substrate having an upper surface on which a semiconductor element is mounted;
a base plate joined to a lower surface of the insulating substrate;
a case member surrounding the insulating substrate and adhered to the base plate;
a sealing resin provided in a region surrounded by the base plate and the case member, so as to seal the insulating substrate; and
a holding plate projecting from an inner wall of the case member to above an outer peripheral portion of the insulating substrate, the holding plate being fixed to the inner wall,
wherein an upper surface of the holding plate is sealed in the sealing resin, and
wherein adhesion between the holding plate and the sealing resin is lower than adhesion between the sealing resin and each of the insulating substrate and the semiconductor element.

2. The power module according to claim 1, wherein a releasing layer that is configured to release the sealing resin, is provided on a surface of the holding plate facing the insulating substrate.

3. The power module according to claim 1, wherein the holding plate includes a projection portion at a tip of a surface of the holding plate facing the insulating substrate.

4. The power module according to claim 1, wherein the holding plate includes a material with which adhesion between the holding plate and the sealing resin is lower than adhesion between the sealing resin and each of the insulating substrate and the semiconductor element.

5. The power module according to claim 1, wherein
the case member is provided with a terminal, and
the holding plate is fixed to the inner wall near the terminal.

6. The power module according to claim 1, wherein the holding plate is fixed to an entire periphery of the inner wall.

* * * * *